United States Patent [19]
Stutzmann et al.

[11] Patent Number: 5,810,945
[45] Date of Patent: Sep. 22, 1998

[54] METHOD OF FABRICATING AN ELECTRONIC MICROPATTERNED ELECTRODE DEVICE

[75] Inventors: Martin Stutzmann, Stuttgart; Christoph E. Nebel, München; Paulo V. Santos; Moritz Heintze, both of Stuttgart, all of Germany

[73] Assignee: Max-Planck-Gesellschaft zur Förderung der Wissenschaften e.V., München, Germany

[21] Appl. No.: 545,781

[22] PCT Filed: May 11, 1994

[86] PCT No.: PCT/EP94/01536

§ 371 Date: Mar. 14, 1996

§ 102(e) Date: Mar. 14, 1996

[87] PCT Pub. No.: WO94/27326

PCT Pub. Date: Nov. 24, 1994

[30] Foreign Application Priority Data

May 12, 1993 [DE] Germany .......................... 43 15 959.1

[51] Int. Cl.[6] .................................................. H01L 31/00
[52] U.S. Cl. ...................... 136/258; 136/255; 156/643.1; 156/662.1
[58] Field of Search .............................. 156/628.1, 643.1, 156/662.1; 136/255, 258

[56] References Cited

U.S. PATENT DOCUMENTS

| | | | |
|---|---|---|---|
| 4,404,072 | 9/1983 | Kohl et al. | 156/643.1 |
| 4,778,478 | 10/1988 | Barnett | 437/5 |
| 4,808,462 | 2/1989 | Yaba et al. | 428/142 |
| 4,897,150 | 1/1990 | Dooley et al. | 156/628.1 |
| 5,296,392 | 3/1994 | Grula et al. | 437/56 |
| 5,316,969 | 5/1994 | Ishida et al. | 437/950 |
| 5,344,522 | 9/1994 | Yagi et al. | 156/628.1 |

FOREIGN PATENT DOCUMENTS

| | | |
|---|---|---|
| 1161969 | of 1984 | Canada . |
| 0058566 | of 1982 | European Pat. Off. . |
| 3106884 | of 1982 | Germany . |
| 3318852 | of 1984 | Germany . |
| 3630284 | of 1988 | Germany . |
| 58-154233 | 9/1983 | Japan .................................. 156/643.1 |
| 60-138092 | 7/1985 | Japan .................................. 156/643.1 |
| 62-193287 | of 1987 | Japan . |
| 3-218683 | of 1991 | Japan . |
| 3-62974 | of 1991 | Japan . |
| 03-151672 | 6/1991 | Japan ..................................... 136/256 |
| 5036656 | of 1993 | Japan . |
| 2226182 | of 1990 | United Kingdom . |
| 90/013139 | 11/1990 | WIPO ............................... 156/643.1 |

OTHER PUBLICATIONS

Applied Physics Letters 59 (1991) 16 Dec., No. 25, New York.US.
J.Appl.Phys. 57 (1), Jan. 1985 pp. 39–44.
IBM Technical Disclossure Bulliten, Apr. 1988, vol. 30, NL11.
Patent Abstracts of Japan JP5036656, vol. 17 No.325.
Sov.Tech.Phys. Lett.9 (7), Jul. 1983 pp. 365–367.
Optics and Laser Techn. 1987 vol. 19 No. 2 Apr. 1987 pp. 75–82.
J.Appl.Phys. 62 (9), 1 Nov. 1987 pp. 3656–3659.

(List continued on next page.)

*Primary Examiner*—John Niebling
*Assistant Examiner*—Kevin F. Turner
*Attorney, Agent, or Firm*—Nields, Lemack & Dingman

[57] ABSTRACT

An electronic device, particularly a solar cell, comprising a layer (16) of amorphous silicon (a-Si) and at least two layered electrodes (14, 18) each having an interface (20, 22) bordering said a-Si layer, in which at least one of the electrodes (14) is provided with pattern elements (14a) forming a preferably periodic micropattern. The average spacing of the pattern elements is preferably in the order of magnitude of the charge carrier drift lengths and is generally smaller than 1 $\mu$m, particularly 50 to 500 nm. The micropattern is produced preferably by the effect of a laser beam interference pattern.

14 Claims, 5 Drawing Sheets

OTHER PUBLICATIONS

Japanese Journal of Applied Physics V.26, No. 7, Jul., 1987 pp. L1208–L1210.

Applied Optics. vol. 25, No. 20. 15 Oct. 1986 pp. 3690–3696.

Feingeratetchnik, Berlin 36 (1987) 2 pp. 75–78, Together with a relevance sheet.

Copy of the International Search Report.

IBM Tech.Disc. Bull. (May 1988) vol. #12 pp. 6974–75.

Alum et al., "Diffraction gratings produced at a semiconductor surface by picosecond laser annealing", Sov. Tech. Phys. Lett., vol. 17, No. 12, pp. 633–634, Dec. 1, 1981.

Koval'chuk et al., "Epitaxial crystallization of silicon films deposited on GaP substrated during laser interference annealing", Sov. Tech. Phys. Lett., vol. 9, No. 7, pp. 365–366, Jul. 1, 1983.

Lum et al., "Holographic photoelectrochemical etching of diffraction gratings in n–InP and n–GaInAsP for distributed feedback lasers", J. Appl. Phys., vol. 57, No. 1, pp. 39–44, Jan. 1, 1985.

"Material patterning and removal by holographically imaged laser radiation", IBM Tech. Disc. Bull., vol. 27, No. 12, pp. 6974–6975, May 1, 1985.

Kakkad et al., "Highly conductive ultrathin crystalline Si layers by thermal crystallization of amorphous Si", Appl. Phys. Lett. vol. 59, No. 25, pp. 3309–3311, Dec. 16, 1991.

Hack et al., "Integrated Conventional and laser re–crystallized amorphous silicon thin film transistors for large area imaging and display applictions", J. Non–Cryst. Sol., vol. 164–166, pp. 727–730, 1993.

Heintze et al., "Surface controlled plasma deposition and etching of silicon near the chemical equilibrium", J. Non–Cryst. Sol., vol. 164–166, pp. 985–988, 1993.

Heintze et al., "Lateral structuring of silicon thin films by interference crysrtallization", Appl. Phys. Lett., vol. 64, No. 23, pp. 3148–3150, Jun. 6, 1994.

METHOD OF FABRICATING AN ELECTRONIC MICROPATTERNED ELECTRODE DEVICE

FIELD OF THE INVENTION

The present invention relates to an electronic device having the features indicated in the preamble of claim 1, the invention further relating to advantageous methods of fabricating such devices.

The operating behaviour of many electronic devices, such as solid-state or semiconductor devices including a solid-state or semiconductor system or some other controlled medium between two electrodes, particularly in the form of a film structure, is substantially influenced by how the electrodes are configured and patterned. One typical example are thin-film solar cells comprising a layer of amorphous silicon (a-Si). The problem forming the basis of the invention will be explained with reference to this preferred example application without being restricted thereto, however.

DESCRIPTION OF THE RELATED ART

As regards photocells, particularly solar cells, attaining a high efficiency in converting light energy into electrical energy whilst maintaining the production costs low and the life high is a problem which is still awaiting a satisfactory solution and which hitherto has prevented photovoltaic applications on a large scale. The most promising solution would appear to be at this time thin-film silicon solar cells having a p-i-n structure. Solar cells of this kind usually contain a so-called absorber layer of substantially inherently conducting amorphous silicon arranged between an $n^+$conducting doped and $p^+$conducting doped layer of amorphous silicon. This p-i-n film structure is normally arranged on a transparent substrate, a layer of a transparent electrically conductable material, usually of a metal oxide (TCO= Transparent Conducting Oxide) being disposed between the substrate and the film structure. Solar cells of a-Si require substantially less material than solar cells of single-crystal silicon (c-Si), since a-Si absorbs light in the visible spectral range substantially greater than c-Si, so that layer thicknesses of the order of a few hundred nanometers are sufficient with a-Si solar cells, whilst for solar cells of c-Si, layer thicknesses of the order of 100 to 300 $\mu$m are necessary to achieve an adequate absorption of light in the visible spectral range. In addition, layers of a-Si are lighter in weight and require less complicated fabrication than single-crystal slices of silicon as required for c-Si solar cells.

One major drawback of a-Si as compared to c-Si is, however, the low mobility of the minority charge carriers (defect electrons). Even with the thin layer thicknesses, as are typical for a-Si solar cells, the majority of the photogenerated charge carriers recombine before they reach the electrode comprising the $p^+$conducting layer. The recombination energy destroys Si—Si bonds in the absorber layer which in the case of strong light irradiation results in a substantial reduction in efficiency (light-induced degradation; Staebler/Wronski effect) in relatively short time.

To minimize this light-induced degradation the thickness of the absorber layer (consisting substantially of inherently conducting a-Si and thus the necessary charge carrier drift lengths) was reduced. To nevertheless ensure adequate absorption of the incident light, the surface of the p-i-n film structure opposite that of light incidence was mirrored and the interface between the TCO layer of the electrically conducting oxide and the bordering silicon layer was patterned so that the incident light is refracted and/or dispersed at this interface. However, despite these measures the light-induced degradation caused by the recombination of minority charge carriers is still too high for practical applications of solar cells.

Similar problems rooted in small minority carrier drift lengths or in the electrode structure are experienced also in other solid-state or semiconductor devices such as electroluminescent devices, semiconductor devices emulating neuronal networks, as well as in LCD displays and many more such devices.

SUMMARY OF THE INVENTION

On the basis of this prior art the present invention is thus based on the object of improving the efficiency of an electronic device in the field concerned.

This object is achieved by the invention as characterized in the claims and as further explained in the following.

In known a-Si thin-film solar cells the interfaces between the absorber layer and $p^+$layer and $n^+$layer acting as the electrodes are plane, that is to say their roughness is maintained within fabrication tolerances, or they have a relatively coarse structure due to the patterning of the electrically conducting oxide layer for optical reasons, which has no substantial effect on the drift lengths of the photogenerated electrons or defect electrons (holes).

In the present solid-state devices, such as e.g. a-Si thin-film photocells, at least one of the two mentioned interfaces, preferably both interfaces of the electrodes, are microscopically patterned, they thus forming a kind of microscopic relief pattern which is preferably periodic. "Microscopic" in this context is to be understood as indicating patterns having lateral spacings of the patterning elements of less than 1 $\mu$m or so, preferably between 50 and 500 nm and a roughness which is substantially greater than the roughness stemming from fabrication and amounting to e.g. at least 10% of the thickness of the absorber layer or at least 50 nm. When both interfaces are patterned, the protuberances protruding into the absorber layer of the one interface mate with the protuberances or undulations protruding into the other absorber layer of the other interface. These protuberances may generally have a height of up to 50% of the thickness of the absorber layer. Due to the patterning of the electrode interfaces short drift lengths result for the charge carriers and thus a considerably reduced light-induced degradation as well as an improved collection efficiency.

The invention relates further to a preferred method of producing such patterned interfaces or electrode surfaces. In accordance with the invention this patterning is implemented thermally by a laser beam interference pattern. These methods as such are nothing new, except that they have hitherto not been used to to pattern electrode surfaces and to produce electrode patterns. From a publication by Ahlhorn et al, SPIE Vol. 1023 Excimer Lasers and Applications (1988), pages 231–234 generating diffraction gratings holographically by means of a laser beam interference pattern is known. From a publication by Portnoi et al, Sov. Tech. Phy. Lett. 8(4), April 1982, pages 201, 202 laser tempering films of gallium phosphide is known. From a publication by Koval chuk et al, Sov. Tech. Phys. Lett. 9(7), July 1983, pages 365, 366 epitaxial crystallization of silicon films deposited on GaP substrates by laser interference pattern heating for producing diffraction gratings is known.

BRIEF DESCRIPTION OF THE DRAWING

The invention will now be described by way of an example relating to thin-film solar cells, representing a particularly advantageous field of application, which however is not at all to be understood as being limited thereto, of the invention with reference to the drawing, the FIGS. of which disclose further features and advantages of the invention, in which:

FIG. 7 along with the section views schematicized in FIGS. 7a thru 7e illustrate a preferred method of fabricating a photocell in accordance with FIG. 4;

DESCRIPTION OF THE PREFERRED EMBODIMENTS

Figure 1:
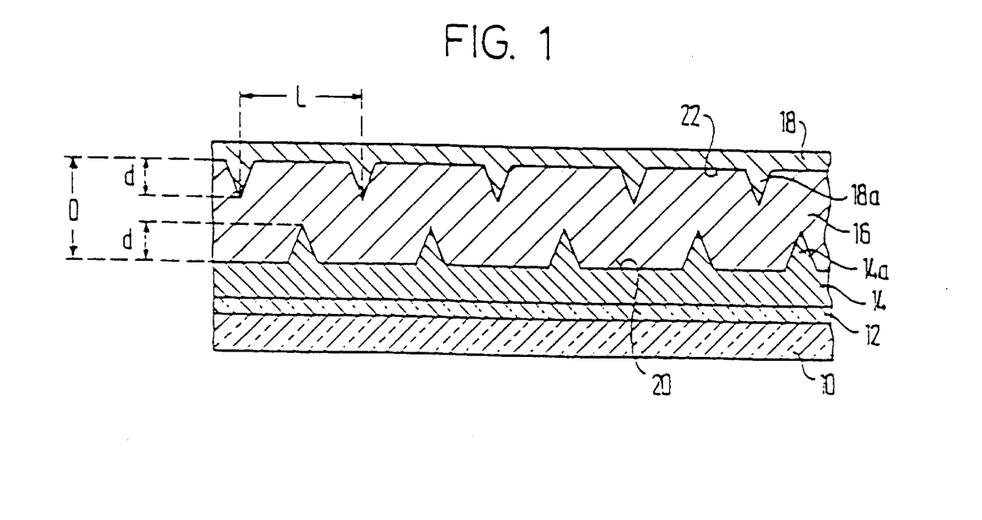
FIG. 1 represents schematically a greatly magnified principle section arrangement of a solar cell in accordance with one embodiment of the invention.

The solar cell represented in FIG.1 includes a transparent layer 10 on which a series of layers in the sequence of a thin, transparent electrically conductive electrode layer 12 (TCO layer), a first p$^+$conducting layer 14 of microcrystalline silicon, an absorber layer 16 of inherently conductive amorphous Si:H and, in conclusion, a n$^+$conducting layer 18 of microcrystalline silicon is provided. The layer 14 and/or the layer 18 may be aggregated with carbon and/or germanium (Si—C, Si—Ge) to enhance their transparency, especially in the blue range of the solar spectrum and/or to enhance the internal electrical field.

The doped layers 14 and 18 serving as electrodes may generally be amorphous or single-crystal and contain apart from Si also Si—O, Si—C, Si—N or Si—Ge.

In the known solar cells of this type the interfaces 20, 22 between the absorber layer 16 and the layer 14 and layer 18 respectively are smooth, except for a roughness due to fabrication, in particularly plane, or they have a relatively coarse pattern if the TCO layer 12 is configured as an optical "prismatic" film to enhance the light paths in the absorber layer. In accordance with the invention at least one of these interfaces 20, 22, preferably at least the interface 20 of the electrode layer 14 accommodating the defect electrons (holes) features a relief-like microscopic pattern which is provided irrespective of any pattern of the interface of the TCO layer 12 facing away from the substrate or in addition to such a pattern. In preferred embodiments this pattern is periodic, but it may be e.g. dot-like (zero-dimensional) or line-like (single dimensional). The lateral spacings L of the elements 14a, 18a making up the pattern should have the order of magnitude of the charge carrier drift lengths. In practice L is expediently smaller than roughly 1 $\mu$m and may e.g. be between 100 nm and 500 nm. In particularly preferred embodiments the patterns of the two interfaces are at least approximately complementary, i.e. as represented in FIG. 1 the protuberances 14a of the layer protruding into the layer 16 mate with the protuberances 18a of the layer 18 protruding into the absorber layer 16.

The roughness, that is to say the distance d as calculated perpendicularly to the layer plane between the valleys and peaks of the interface 20 or 22 concerned is substantially greater than the roughness due to fabrication tolerances and substantially smaller than for a patterned TCO layer and may in practice amount to at least 10% up to 50% or more of the thickness D of the layer 16. The structure and roughness of the interface 20 may be different to those of the interface 22. One of these interfaces may also be smooth.

In general the period L or the average spacing of the peaks or protuberances 14a and 18a respectively is expediently roughly equal to twice the drift length of the charge carriers in the absorber layer 16.

Figure 2:
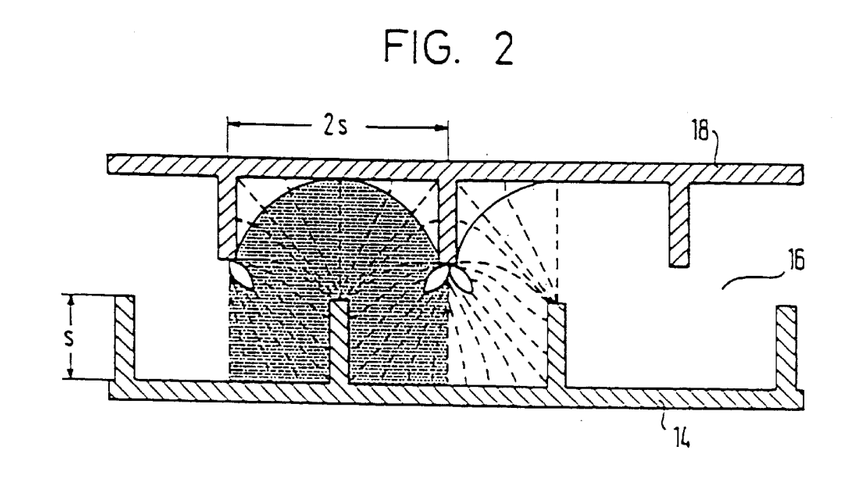
FIG. 2 is a greatly magnified schematic representation of the profile of the electrical field (shown dashed) and the charge carrier drift zones (shown dotted) in the absorber layer of a solar cell of the type shown in FIG. 1 comprising two patterned electrode layers, the charge carrier drift length being designated by "s"
Figure 3:
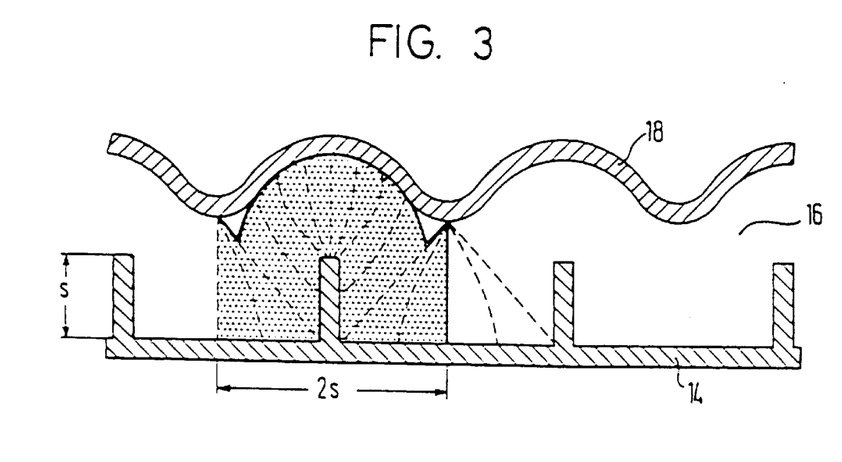
FIG. 3 represents a solar cell as shown in FIG. 2 but configured optimized as regards the carrier collection efficiency, in which only one electrode layer is patterned.

Due to the patterning of the interfaces a better collection efficiency materializes for the defect electrons in the absorber layer due to higher local electric fields or a better electrode geometry, as evident from the field lines in FIG. 2 and FIG. 3. Due to the micropatterning the absorption length of the incident light is increased by diffraction and/or multiple reflection, so that the thickness of the absorber layer can be reduced. Further advantages are: decelerated and reduced degradation due to reduced recombination. Due to the microcrystalline structure of the layers 14, 18, which act as electrodes, a high transparency results by reason of the indirect band structure. Carbon aggregation enables a high transparency of the microcrystalline layer 14, operating as a window, to be achieved. The transparency of the microcrystalline silicon layers 14, 18 may be enhanced by aggregating carbon in the blue portion of the solar spectrum. Patterning the transparent TCO layer 12, which is expensive and difficult to optimize, is now no longer necessary since the microstructure of the electrode interface surface(s) has a dispersing effect.

The microcrystalline structure of the layers 14 and 18 has the additional advantage that photogenerated charge carriers gain access to the amorphous absorber layer 16 due to diffusion from these layers and thus contribute towards enhancing the efficiency. The single-crystal crystallites of the microcrystalline material forming the layers 14 and 18 protrude like needles into the intrinsic amorphous material of the 16 which assures an effective charge carrier collection and drain. The substantially higher doping efficiency of the crystalline material as compared to amorphous material allows an abrupt interface to materialize at the crystalline/amorphous junction which results in high electric fields at the interface.

Figure 4:
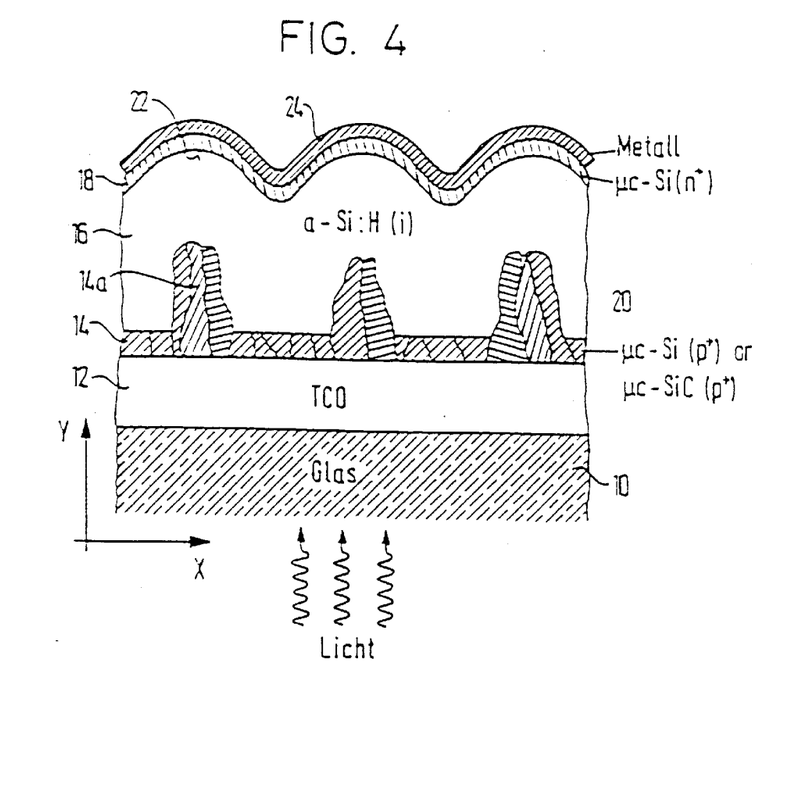
FIG. 4 is a simplified representation of a practical embodiment of a solar cell in accordance with the invention on a greatly magnified scale as shown in FIG. 3.

FIG. 4 is a simplified representation of one practical example embodiment of a silicon solar cell in accordance with the invention, wherein, the same as in FIG. 1, like parts are identified by like reference numerals.

The microcrystalline p$^+$layer 14 has a regular pattern formed by the protuberances 14a protruding into the amorphous silicon layer 16. The interface 22 of the amorphous layer 16 opposite the layer 14 has a wavey pattern which is at least roughly complementary to that of interface 20. Thus, the configuration is similar to that as shown in FIG. 3, it featuring optimum field distribution and carrier collection due to the bunching-type profile of the electric field lines from the protuberances 14a to the opposite, roughly concentric, dome-shaped surface areas of the interface 22.

Figure 5:
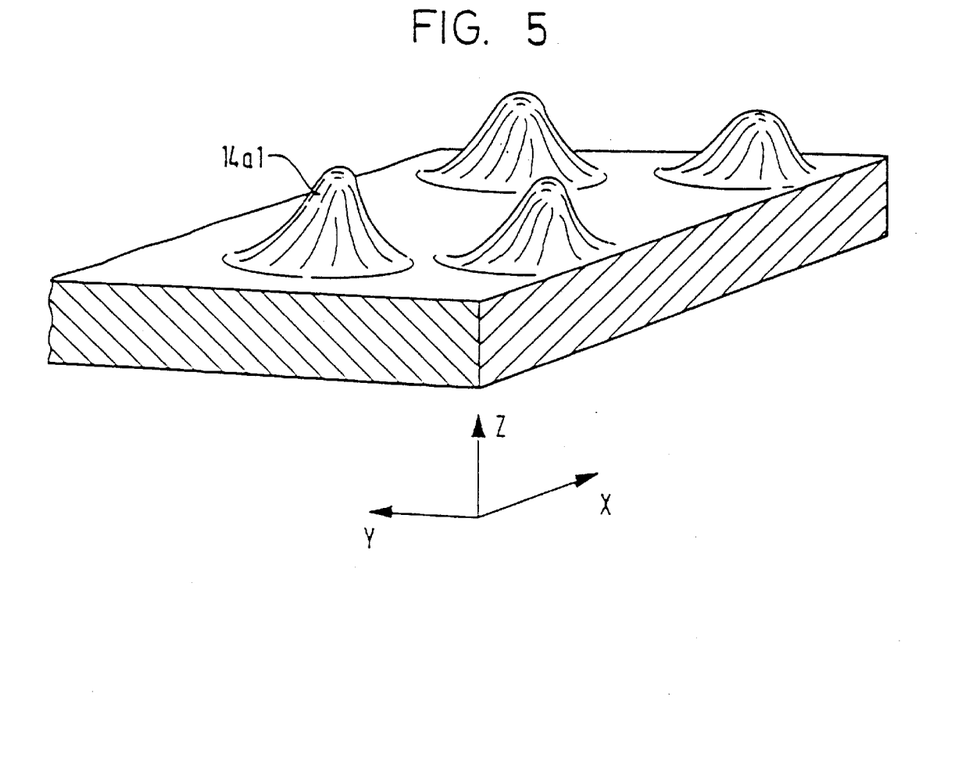
FIG. 5 represents a zero-dimensional or dot-type relief pattern in perspective which is applicable to an electrode interface of a solar cell or other semiconductor device in accordance with the invention.
Figure 6:
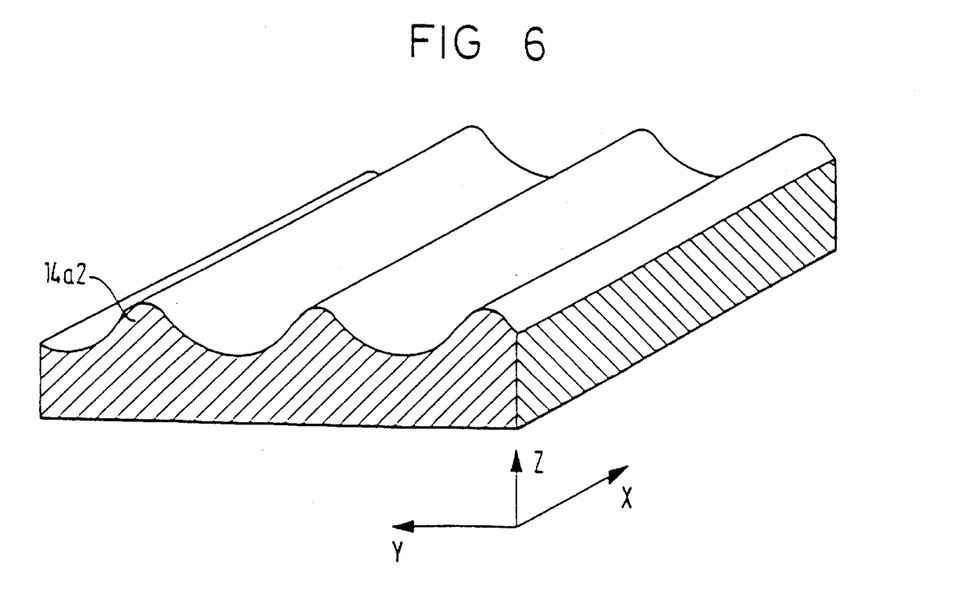
FIG. 6 represents another single-dimension or line-type relief pattern.

The projections 14a may be dot-type structures 14a1 as shown in FIG. 5, or line-type structures 14a2 as represented in FIG. 6. These protuberances 14a, 14a1 and 14a2 may be generated by selective irradiation during production of the layer, e.g. by laser beaming, the patterns being produceable by interference. The dot-type pattern may be generated by two intersecting interference strip patterns.

Figure 7A:
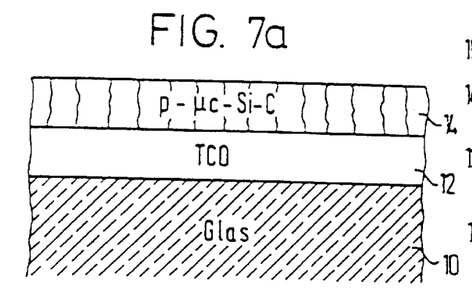

A preferred method of producing a solar cell of the type as described above will now be explained in the following with reference to FIGS. 7a thru 7e:

For the substrate 10 glass, metal or a film material may be used. If a transparent substrate 10 is involved, and it is intended to radiate the light through the substrate, firstly a transparent electrically conducting oxide layer 12, e.g. of indium oxide is deposited. To produce the photocell as such, large-surface p$^+$conducting microcrystalline silicon or Si—C is deposited as the electrode layer 14 on the substrate, the same as in producing the other Si layers, preferably by a plasma CVD method (FIG. 7a).

Figure 7B:
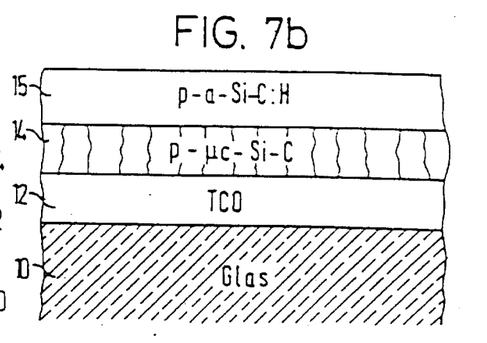

On the layer 14 a thin, lightly doped (e.g. p-doped) layer 15 of amorphous silicon is deposited (FIG. 7b).

Figure 7C:
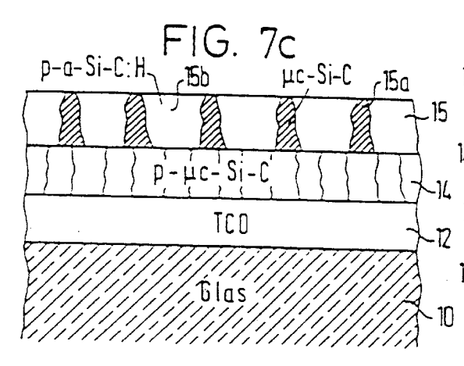

This layer is patterned next by laser interference recrystallization (FIG. 7c), an interference pattern being produced for this purpose on the surface of the lightly doped layer 15 by the laser beam (not shown) resulting in a selective recrystallization of this layer in the zones 15a (corresponding to the projections 14a in FIG. 4) occurring with enhanced beam density (FIG. 7c).

Figure 7D:
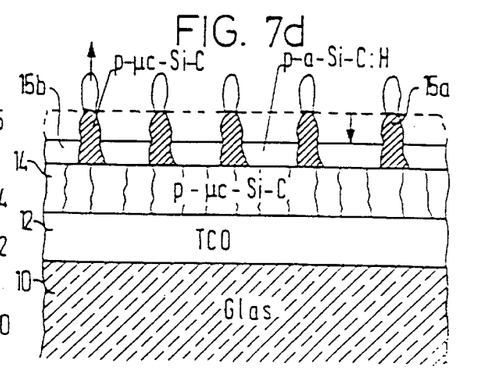

The amorphous residual layer 15b may be removed by plasma etching. By suitably selecting the parameters of the plasma discharge and the gas composition and/or continuous effect of the laser beam interference pattern a selective growth of the microcrystalline phase along with simultaneous etching of the amorphous phase may be achieved. As an alternative, repeated irradiation during deposition of additional amorphous silicon may be employed to achieve the amorphous/microcrystalline conversion and thus attain a increase in the size of the microcrystallites (FIG. 7d).

Figure 7E:
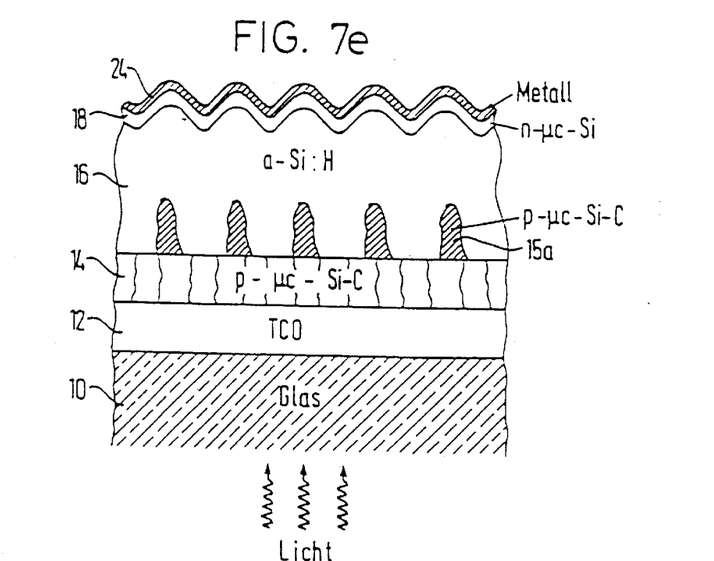

It is subsequently expedient to implement optimization of the micropatterned layer by hydrogen passivation and then allowing a new amorphous intrinsically conducting layer 16 to grow which ensures an optimum interface to the microcrystalline silicon (FIG. 7e). This forms the layer 16 serving as the optical absorber and may be optimized by alloying with hydrogen and/or generating a doping gradient to improve the charge carrier collection efficiency. Generating the absorber layer 16 is preferably done by P-CVD with SiH$_4$ in a hydrogenated atmosphere, resulting in H being incorporated in the resulting amorphous Si of the layer 16. This layer automatically receives a patterned surface corresponding to that of the interface 22, which—as seen inside out from the layer 16—is approximately complementary to that of interface 20.

On the surface of this amorphous silicon layer a thin, n-doped layer 18 is then generated which, as the case may be, forms together with an electrically conducting oxide layer or a light-reflecting metallization layer 24, e.g. of Al or Ag, the second electrode (FIG. 7e).

The sequence of the layers may be inverted. Depositing the layers is preferably done by a plasma CVD method, but it may also be achieved by sputtering or cathode sputtering. In the production of layers doped with hydrogen (Si:H) and for hydrogenation the atmosphere in the step of the method concerned contains hydrogen. All steps may be implemented one after the other without breaking the vacuum. The method is fully compatible with the conventional methods of fabricating a-Si solar cells.

In a modification of the method as described above a doped microcrystalline Si layer 14 is produced on the TCO layer and protuberances 14a are formed on the former by laser-beam induced selective deposition of microcrystalline Si, as is shown in FIG. 4. On this patterned electrode layer, following passivation with hydrogen, the a-Si absorber layer, the second doped electrode layer 18 and finally the metallization layer 24 are deposited.

Figure 8:
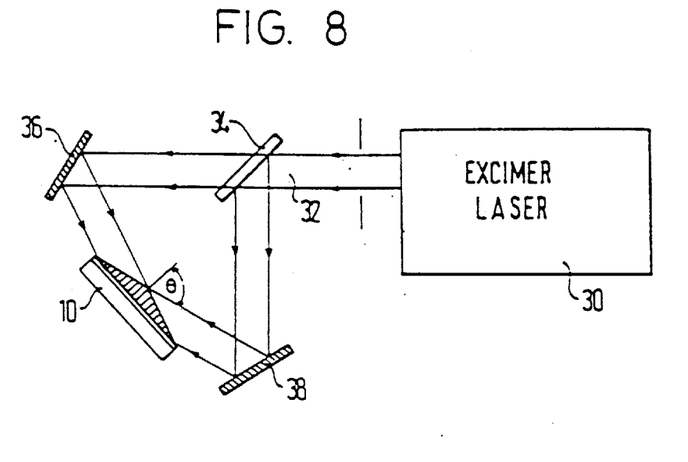
FIG. 8 is a schematic representation of an apparatus for producing a laser beam interference pattern.

One preferred practical embodiment of the invention configured as shown in FIG. 4 had the following parameters:
layer 14: p-conducting $\mu$c Si
  lateral conductivity roughly $6.10^{-4}$ (Ohm cm)$^{-1}$ conductivity in the crystallites of the $\mu$c Si comparable to c-Si or c-Si—C (5–50 (Ohm cm)$^{-1}$), thickness approx. 10 nm to approx. 100 nm
interface 20: line patterned, d approx. 200 nm
  L approx. 400 nm
layer 16: a-Si:H,
  dark conductivity $10^{-12}$–$10^{-10}$ (Ohm cm)$^{-1}$ thickness approx. 0.5 $\mu$m
interface 22: wavey patterned complementary to 20
  d approx. 100 . . . 500 nm
layer 18 n-conducting $\mu$c-Si
  conductivity in the crystallites >50 (Ohm cm)$^{-1}$, lateral conductivity roughly $6.10^{-4}$ (Ohm cm)$^-$thickness approx. 10 nm FIG. 8 shows an apparatus for producing a line-shaped laser beam interference pattern as may be used in implementing the method described above for fabricating patterned electrodes. The apparatus shown in FIG. 8 contains a laser 30, e.g. a Nd-YAG or excimer laser which furnishes a coherent beam 32. By a beam splitter 34 the beam 32 is split into two partial beams which are focussed by mirrors 36, 38 at a specified angle on a surface to be patterned, e.g. the surface of an a-Si layer 15 (FIG. 7b) on a substrate 10. This substrate 10 is located in a vacuum chamber (not shown) in which the PVCD method is carried our. The laser 30, the beam splitter 34, the mirrors 36 and 38 may be located outside of the vacuum chamber, the partial beams reflected by the mirrors then be directed into the vacuum chamber through suitable windows. Micropatterning is dictated by the choice of laser beam wavelength, the angle of incidence and the arrangement of the mirrors. Particularly advantageous is patterning by brief exposure to intensive laser pulses.

Instead of forming electrodes having a micropattern by recrystallization as described above, contact strips of metal or doping sections may also be produced by the effect of a laser beam interference pattern.

To produce electrodes having a plurality of closely-spaced fine metal strips in periods of e.g. 20 to 200 nm the surface on which the electrodes are to be formed is vacuum deposited with metal, e.g. Cr and subsequently micropatterning is done by depositing strip-like regions of the continual layer by means of the laser beam interference pattern, the result then being an electrode of metal strips in a periodic arrangement.

Micropatterned doping patterns or sections may be produced in that an amorphous and already doped (e.g. with boron, phosphor, arsenic, gallium etc) semiconductor layer is recrystallized in selected locations, the electronic activation of the doping atoms taking place at the same time in the crystallized zones. The remaining amorphous layer may then be removed, as already described above, whereby doping the amorphous silicon may be achieved e.g. by admixing phosphine or diborane to the silane in the plasma CVD. A doped pattern layer is especially important, particularly in solar cell applications (for producing p or n contacts).

Micropatterned doping patterns or sections may also be produced for example by applying a source of dopant such as e.g. boronsilicate glass, doped amorphous silicon, and the like, to the surface of semiconductor body and then diffusing the dopant in place selectively under the effect of a laser beam interference pattern. The dopant source may also be a gas or vapor.

Figure 9:
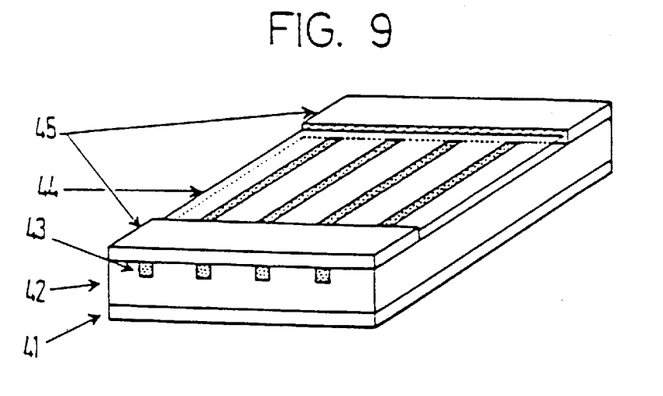
FIG. 9 is a simplified perspective representation of a solar cell having micropatterned electrodes in accordance with a further embodiment of the invention.
Figure 10:
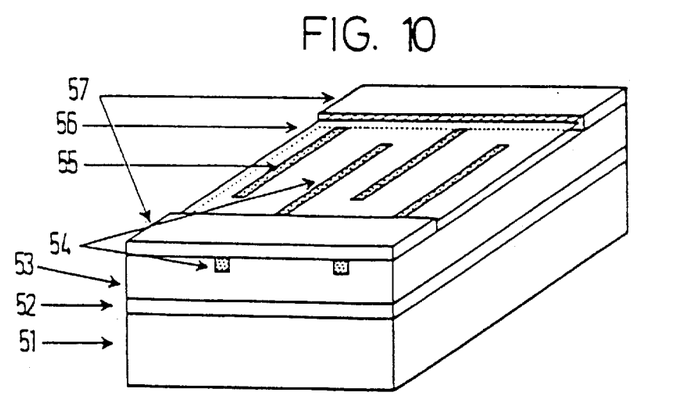
FIG. 10 is a perspective representation of a further embodiment of a solar cell having micropatterned electrodes in accordance with a further embodiment of the invention.

In FIG. 9 and FIG. 10 two embodiments of solar cells are depicted, the electrodes of which are patterned or formed by the method as already described above. The solar cell as shown in FIG. 9 contains a back contact of a p-conducting layer analogous to layer 14 in FIG. 4 and FIG. 7e, an amorphous, crystalline or single-crystal absorber layer 42 corresponding to the absorber layer 16, an n-conducting contact layer 43, a reflex-reducing layer 4 as well as a metallization layer which is depicted broken away in the middle. The strip-like n-type contact 43 is produced by a diffusion of doping atoms from the gas phase or a doped layer (not shown) by means of a laser beam interference pattern.

FIG. 10 shows a further solar cell having micropatterned electrodes. This comprises a substrate 51, a passivation or antireflex layer 52, an active amorphous or crystalline absorber layer 53, a p-type back contact 54, an n-type contact 55, an antireflex layer 56 and a metallization layer 57, depicted partly broken away. The strips of the n-type contact and/or of the p-type contact are produced with an interfering laser beam by diffusing doping atoms e.g. from the gas phase or a doped layer.

The following further applications of the methods described thus far are conceivable:

1. Producing single-crystal seeds for the low-temperature deposition of polycrystalline semiconductors (that is to say not only Si, but also Ge, GaAs, and possible diamond).

In this arrangement, following localized selective recrystallisation of doped or undoped amorphous layers and removal of the amorphous zones, the same as before, the dot or strip-like crystalline zones are remelted thermally or by homogenous laser beaming into single-crystal seeds in a second step, this being feasible with commercially available lasers (Nd:YAG, $CO_2$) with periods between 1 $\mu$m and 100 $\mu$m.

The resulting regularly arrangement of the seeds is then an ideal substrate for an epitaxial further growth from the gas phase (CVD) or also the liquid phase (LPE). It is also conceivable to deposit on such a seed substrate a thick amorphous layer which is in turn recrystallized.

One important aspect in this respect is that the seed crystals may be doped differently to that of the subsequently deposited polycrystalline layer. In this way every crystal, for example, may be provided with its own dot contact, permitting the influence of the grain boundaries on the charge carrier transport to be reduced.

A pattern such as that described above would be of interest particularly for photovoltaic applications (poly-Si cell on a "cheap" substrate), but also for large-scale electronic circuitry and three-dimensional integration.

2. Production of non-periodic patterns in the $\mu$m or sub-$\mu$m range by the method of laser recrystallization by holography and etching.

For this purpose a two-dimensional hologram is produced at the location of the layer by suitable and known means which may then used for impregnating a principally arbitrary pattern by laser pulse crystallization. This actually is merely a subcase of the original method, the elimination of the periodic character of the interference pattern permitting other applications, however, the following being particularly worthy of mention in this respect:

a) Patterning in the sub $\mu$m range or in the $\mu$m range as a replacement for conventional lithography, e.g. for small series fabrication of ASICs, this assuredly necessitating apart from patterning and selective etching also recrystallization by thermal or laser treatment.

b) Application of laser crystallization of a-Si:H (and other materials) for three-dimensional integration, since this only involves in conjunction with plasma deposition and selective etching low-temperature processes ($\leq 300°$ C.) which affect the layers lying underneath as little as possible. One special application would be e.g. the use of such a method for producing an etching or exposure mask of microcrystalline Si for lithography, whereby all of the steps necessary would also be implementable in a process chamber (vacuum).

c) Parallel transformation of any patterns (e.g. written information) for safe information storage (archiving), whereby an amorphous Si layer is recrystallized localized selectively, simultaneously involving a large amount of information to be inscribed on a surface area of typically 1×1 $cm^2$. Following removal of the amorphous zones the information then remains durably stored (no damage due to fields, wetness, high temperature).

What is claimed is:

1. Method of fabricating a solar cell containing patterned semiconductor layers wherein
   a) an amorphous layer of a prescribed semiconductor material is formed on a substrate having at least one layer thereon which is a lower microcrystalline semiconductor layer adapted to receive said amorphous layer,
   b) said amorphous layer is recrystallized in selected locations by the effect of a laser beam interference pattern, leaving an amorphous residual layer,
   c) in a selective gas phase etching process, said amorphous residual layer is partly removed so that perpendicular protuberances of a microcrystalline semiconductor material are produced which are simultaneously growing by the effect of depositing the removed semiconductor material on said protuberances and by the continuous effect of the laser beam interference pattern, thereby forming a patterned layer,
   d) an absorber layer of a-Si semiconductor material is formed on said patterned layer by CVD with $SiH_4$ in a hydrogenated atmosphere, and
   e) an upper doped semiconductor layer of a prescribed semiconductor material is formed on said absorber layer.

2. The method as set forth in claim 1, wherein prior to said step (a) of the method said lower microcrystalline semiconductor layer is formed of the same semiconductor material as that of said amorphous layer on a substrate.

3. The method as set forth in claim 1, wherein at least one of said lower microcrystalline semiconductor layer and said amorphous layer is doped.

4. The method as set forth in claim 1 for fabricating a solar cell, wherein said upper doped semiconductor layer is formed with a pattern which is complementary to said pattern of said patterned layer.

5. The method as set forth in claim 4, wherein said upper dosed semiconductor layer is configured with recesses such that these locate above and between said protuberances of said patterned layer.

6. The method as set forth in claim 4, wherein the semiconductor material of said patterned layer is silicon and said patterned layer and said upper doped semiconductor layer are aggregated with at least one of the elements carbon and germanium.

7. The method as set forth in claim 5, wherein the patterning of said patterned layer and said upper doped semiconductor layer is periodic, and the average spacing of said protuberances or said recesses roughly equals twice the drift length of the charge carriers in said absorber layer.

8. The method as set forth in claim 1 or 4, wherein the semiconductor material of said patterned layer is silicon and the semiconductor material of said absorber layer is amorphous silicon doped with hydrogen and in step (c) of the method the amorphous residual layer is passivated by treatment with hydrogen.

9. The method as set forth in claim 1 or 4, wherein following implementation of said step (c) of the method a selective growth of said protuberances is achieved by the application of additional amorphous semiconductor material and the repeated effect of said laser beam interference pattern.

10. The method as set forth in claim 1 or 4, wherein following step (b) or (c) of the method a dopant source is disposed above said amorphous layer and said dopant is selectively diffused into said recrystallized zones by irradiating said dopant source with said laser beam interference pattern.

11. The method as set forth in claim 10, wherein said dopant source is a boron silicate glass.

12. The method as set forth in claim 10, wherein said dopant source is a gas or a vapor.

13. The method as set forth in claim 1 or 4, wherein in a further step of the method recrystallized zones of said amorphous layer are remelted by a thermal treatment or by homogenous laser irradiation into single-crystal seeds.

14. The method as set forth in claim 1 or 4, wherein said laser beam interference pattern is produced in the form of a two-dimensional hologram having a non-periodic pattern.

* * * * *